United States Patent
Fautz et al.

(10) Patent No.: US 9,970,998 B2
(45) Date of Patent: *May 15, 2018

(54) METHOD AND MAGNETIC RESONANCE APPARATUS TO DETERMINE A B1 PHASE MAP

(71) Applicant: Siemens Aktiengesellschaft, Munich (DE)

(72) Inventors: Hans-Peter Fautz, Forchheim (DE); Patrick Gross, Ismaning (DE); Rene Gumbrecht, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 864 days.

This patent is subject to a terminal disclaimer.

(21) Appl. No.: 14/328,983

(22) Filed: Jul. 11, 2014

(65) Prior Publication Data

US 2015/0015258 A1 Jan. 15, 2015

(30) Foreign Application Priority Data

Jul. 11, 2013 (DE) .......................... 10 2013 213 592

(51) Int. Cl.
 *G01R 33/24* (2006.01)
 *G01R 33/565* (2006.01)
(52) U.S. Cl.
 CPC .......... *G01R 33/246* (2013.01); *G01R 33/243* (2013.01); *G01R 33/56563* (2013.01)
(58) Field of Classification Search
 USPC .................. 324/300–322; 600/407–435; 382/128–132
 See application file for complete search history.

(56) References Cited

U.S. PATENT DOCUMENTS

2007/0085537 A1 4/2007 Feiweier
2009/0256567 A1 10/2009 Aksit et al.
(Continued)

FOREIGN PATENT DOCUMENTS

EP 2 503 350 A1 9/2012

OTHER PUBLICATIONS

Duan et al: "Fast Simultaneous $B_0$/$B_1$ Mapping by Bloch-Siegert Shift with Improved Gradient Scheme and Pulse Design", Proc. Intl. Soc. Mag. Reson. Med. vol. 20 (2012), p. 2504.
(Continued)

*Primary Examiner* — Melissa Koval
*Assistant Examiner* — Tiffany Fetzner
(74) *Attorney, Agent, or Firm* — Schiff Hardin LLP (57) ABSTRACT

In a method to determine a B1 phase map for at least two excitation modes of a radio-frequency coil arrangement of a magnetic resonance apparatus, the radio-frequency coil arrangement having multiple independently controllable transmission channels, and the B1 phase map describing, with spatial resolution, the phase of radio-frequency field this is generated in a respective excitation mode relative to a common reference phase map, first magnetic resonance data describing the phase change of a basic magnetic field of the magnetic resonance apparatus between a first echo time and a second echo time are acquired, and are evaluated to determine a spatially resolved Larmor frequency value that describes the deviation from a nominal Larmor frequency of the magnetic resonance apparatus. To correct raw phase maps derived from second magnetic resonance data acquired using a respective one of the excitation modes, a correction map, determined relative to the reference phase map, is calculated and subtracted from the raw phase map under consideration of the Larmor frequency value and the echo (Continued)

times in the acquisition of the second magnetic resonance data.

18 Claims, 3 Drawing Sheets

(56) References Cited

U.S. PATENT DOCUMENTS

| | | | |
|---|---|---|---|
| 2012/0068703 A1 | 3/2012 | Gross et al. | |
| 2015/0015257 A1* | 1/2015 | Fautz .................. | G01R 33/443 324/309 |
| 2015/0015258 A1* | 1/2015 | Fautz .................. | G01R 33/246 324/309 |
| 2015/0077115 A1* | 3/2015 | Fautz .................. | G01R 33/443 324/318 |

OTHER PUBLICATIONS

De Sousa et al: "Simultaneous $B_1+$ and $B_0$ mapping using Dual-Echo Bloch-Siegert (DEBS) sequence", Proc. Intl. Soc. Mag. Reson. Med. vol. 20 (2012), p. 2505.

\* cited by examiner

METHOD AND MAGNETIC RESONANCE APPARATUS TO DETERMINE A B1 PHASE MAP

BACKGROUND OF THE INVENTION

Field of the Invention

The present invention concerns a method to determine a B1 phase map for at least two excitation modes of a radio-frequency (RF) coil arrangement of a magnetic resonance (MR) apparatus that is controlled by multiple independent transmission channels, the B1 phase map describing with spatial resolution, the phase of the radio-frequency field that is generated in, a particular excitation mode, with respect to a common reference phase map. The invention also concerns a magnetic resonance apparatus designed to implement such a method.

Description of the Prior Art

Magnetic resonance imaging is a widely known medical imaging modality. A subject to be examined is introduced into a basic magnetic field with a relatively high field strength (known as the B0 field). In order to acquire magnetic resonance data, for example in a slice of the subject, nuclear spins of this slice are excited and the decay of this excitation produces a signal. Gradient fields are generated by a gradient coil arrangement while radio-frequency excitation pulses (also frequently designated as radio-frequency pulses) are emitted via a radio-frequency coil arrangement. The entirety of the radio-frequency pulses (excitation) generates a radio-frequency field that is typically designated as a B1 field, and the spins of resonant excited nuclei are deflected (flipped), with spatial resolution due to the gradients by an amount known as a flip angle, relative to the magnetic field lines of the basic magnetic field. The excited spins of the nuclei then radiate radio-frequency signals that are acquired and processed further by suitable reception antennas (such as by the same radio-frequency coil arrangement used for excitation) in order to be able to reconstruct magnetic resonance image data.

Conventional radio-frequency coil arrangements are operated in a manner known as "homogeneous mode", for example in a CP mode (circularly polarized mode), wherein a single radio-frequency pulse is emitted with a defined, fixed phase and amplitude to all components of the transmission coil, for example all transmission rods of a birdcage antenna. To increase the flexibility and to achieve new degrees of freedom to improve the imaging, it has been proposed to operate in a manner known as a parallel transmission (pTX), in which multiple transmission channels of a radio-frequency coil arrangement are individually charged (supplied) with individual pulses that can deviate from one another. This entirety of the individual pulses (which, for example, can each be described by the parameters of phase and amplitude) is then defined as a whole in a control sequence that is defined by a parameter set. Such a multi-channel pulse (excitation) that is composed of individual pulses for the different transmission channels is often designated as a "pTX pulse" (for "parallel transmission"). In addition to the generation of spatially selective excitations, field in homogeneities can also be compensated (for example within the scope of "RF shimming").

In order to determine control parameter sets of a control sequence, it is necessary to know the background (thus the B0 field), and to know the effects of the individual transmission channels in the imaging region (in particular the homogeneity volume) of the MR apparatus.

For measurement of the basic magnetic field (B0 field)—designated as a B0 mapping—first magnetic resonance data are typically acquired (preferably via gradient echo imaging) at two different echo times. The phase difference (phase change) of the magnetic resonance data acquired at the different echo times (which can be determined by subtraction of the phases of two magnetic resonance images of the first magnetic resonance data that are acquired at different echo times) is proportional to a deviation of the local B0 field from the nominal basic magnetic field strength, and to the dephasing time (thus the difference of the two echo times). The field deviation is thereby specifically described by a deviation of the Larmor frequency from a nominal Larmor frequency of the magnetic resonance device (a value describing this deviation is designated as a Larmor frequency value in the following).

The phase generated by deviations in the homogeneity of the B0 field thus develops over time, so the effect of the Nyquist phase wrapping must be taken into account because the proportionality of the phase difference of magnetic resonance data acquired at different times to the deviation from the nominal Larmor frequency, and to the difference of the echo times, applies only as long as the phase difference (limited to $2\pi$) corresponds to the actual phase evolution. However, the phases can be further developed by multiples of $2\pi$ depending on the dynamic range of the B0 distribution. This leads to ambiguities and errors in the calculation of the B0 maps. Incorrect associations in the phase evolution manifest themselves as non-physical spatial discontinuities due to the $2\pi$ jumps in the phase difference images. This thus means that an extremely fast development of the B0 phase also occurs if the deviation of the local Larmor frequency from the nominal Larmor frequency is high, such that the phase will go beyond $2\pi$ when the echo time (here the difference of the two echo times) is not short enough, such that the described ambiguity occurs.

The selection of extremely short dephasing times is often not possible due to the sequences that are used, because smaller deviations from the nominal Larmor frequency can no longer be measured with sufficient precision given an extremely short echo time difference.

A few approaches are known in the prior art to solve the ambiguity problem in the association of the measured phase change. It is thus possible to choose the dephasing time (thus the difference of the echo times) to be so short that the phases do not develop by more than $2\pi$ at any location during them. However, since the dynamic range of the B0 field distribution is not known before the measurement, the dephasing time must be chosen to be so short that the sensitivity of the acquisition method is not sufficient, and this procedure is consequently not used (as already explained).

Therefore, it has been proposed to detect and correct phase jumps in the B0 maps in post-processing, under the assumption that the B0 field is spatially continuous. Algorithms that are used for this purpose are known as phase unwrapping algorithms. However, the reliability of such algorithms is often questionable. The primary difficulty is that the entire volume can be composed of non-contiguous partial regions, such that individual partial regions of the B0 maps are separated by voxels that include only noise and are very low in signal. The phase in these voxels can thus not be determined, or can only be determined unreliably.

It has also been proposed to iteratively acquire first magnetic resonance data with increasing dephasing time, consequently increasing difference between the echo times. The shortest dephasing time is thereby selected so that no spatial phase jumps occur. Whether a phase jump will occur given longer dephasing time is estimated from the acquisitions with shorter dephasing times. If this is the case, this is taken into account in the evaluation (reconstruction) of the first magnetic resonance data with longer dephasing time. The phase ambiguity is therefore dispelled, and long dephasing times are enabled for a high sensitivity.

A further alternative procedure is to minimize the phase gradients between adjacent voxels in the B0 maps. In this approach, the B0 maps do not necessarily need to be corrected for phase jumps. However, there is a risk that a calculated B0 shim is optimized for false B0 offsets in different spatial areas. Moreover, no frequency (zeroth order shim) can be calculated from the differential method.

Mapping processes are also known for B1 fields and are designated as "B1 mapping". In general, B1 field maps are acquired for each transmission channel, which means that the B1 field maps show how strong the B1 field is at a specific location in the imaging region given a specific excitation (for example a uniform excitation and/or given a defined transmitter voltage), which means that a complex B1 value (consequently a B1 amplitude and a B1 phase, which can also be differentiated in a B1 amplitude map and a B1 phase map) is associated with each voxel (image point). Typical measurements for a number of excitation modes are thereby conducted. The excitation mode does not necessarily need to be the operation of only one channel; rather, combinations are also possible from which the effect of individual transmission channels can then be concluded.

In order to determine the amplitude of the B1 field, for example, it is known to measure the flip angle that a radio-frequency pulse causes, as described in DE 10 2005 049 229 B3, for example. An excitation mode thereby results in a constant phase shift (consequently a constant B1 field). The B0 phase, that is continuously varying over time (as described), is naturally also acquired in the phase measurement. Therefore, for B1 mapping it is known to use basically the same echo time for the different excitation modes, such that the effect of the B0 field on the phases is kept constant.

If the magnetic resonance data acquired in the B1 mapping are designated as second magnetic resonance data, in the prior art a raw phase map (obtained from the second magnetic resonance data of an excitation mode) is often used as a correction, which means that the correction raw phase map is subtracted from all other raw phase maps so that the consistent effect of the B0 field on the phase drops away, and consequently the phases of the excitation mode used for correction serve as a reference. This means that all other B1 phase maps are defined relative to the B1 phase map used as a correction, which is unproblematic, because it ultimately depends only on the relative phases of the different transmission channels in any event.

This procedure is problematic at higher B0 fields (higher than 1.5 T, for example), because then it is difficult to ensure that the reference excitation mode (or a combination of multiple reference excitation modes) will produce sufficient excitations over the entire imaging region (in particular the subject to be acquired). A defined excitation mode will typically exhibit regions of low excitation sensitivity (transmission sensitivity), such that a smaller flip angle is present in those regions, while in other regions an "over-flipping" can occur so that a low signal-to-noise ratio (SNR) and a poorly defined reference phase are present. Because all other B1 phase maps are determined relative to this reference B1 phase map (in the described correction process), the inaccuracies are ultimately adopted in all other B1 phase maps.

Although it is conceivable in principle to define the B1 field maps without reference to other B1 field maps, the effects of the local Larmor frequency are then still present for the given echo time. As a result, although the B1 field maps determined in such a manner are still correct relative to all other B1 field maps determined in such a manner, they exhibit regions with phase wrapping. This can entail difficulties for the design of the aforementioned control sequences. Because the measurements (data acquisitions) to determine the second magnetic resonance data are in addition to other data acquisitions, phase drift and other time-dependent effects can lead to a displacement (shift) of the borders of the regions of the phase wrapping, such that additional difficulties can occur in the post-processing and in drawing conclusions from the B1 field maps.

SUMMARY OF THE INVENTION

An object of the present invention is to provide an improved method to determine a respective B1 phase map for multiple excitation modes with regard to the reference that is used, and thus to obtain a qualitatively higher-grade and more precise B1 phase map.

This object is achieved in a method of the aforementioned type but wherein, according to the invention, first magnetic resonance data describing the phase change of a basic magnetic field of the magnetic resonance device between a first echo time and a second echo time are acquired and evaluated to determine a spatially resolved Larmor frequency value describing the deviation from a nominal Larmor frequency of the magnetic resonance device, and a correction map determined relative to the reference phase map is calculated for correction of raw phase maps derived from second magnetic resonance data acquired using a respective one of the excitation modes, and the correction map is subtracted from the raw phase map.

The present invention is thus based on the insight that, with the B0 map, a qualitatively high-grade basis appropriately exists in order to correct the effects in the phase that occur due to the deviation of the Larmor frequency from the nominal Larmor frequency, described by the Larmor frequency value. The echo time is then known in the acquisition of the second magnetic resonance data, and the deviation from the nominal Larmor frequency is also known with spatial resolution, such that the phase errors arising due to the B0 effects can be determined, possibly against a defined offset. In other words: the correction map includes the influences of the local Larmor frequencies deviating from the nominal Larmor frequency, such that the correction removes these influences and therefore establishes the relation to the common reference map. The reference phase map can appropriately correspond to a map that would exist given an echo time of zero without active excitation mode; it can consequently correspond to a "zero map" in which every entry is zero. The correction map then corresponds, in its respective entries for the different voxels, to the product of the echo time and the deviation protective of the Larmor frequency of this voxel from the nominal Larmor frequency. It is thus assumed that a phase $$\phi_i + TE^* \Delta \omega_L$$

is measured in the first magnetic resonance data for the i-th excitation mode, wherein TE is the echo time and $\Delta\omega_L$ is the deviation from the nominal Larmor frequency as it results from the first magnetic resonance data, such that only $\phi_i$ remains given per-voxel subtraction if it is corrected. Naturally, it is also possible in principle to introduce an offset (which is identical for all excitation modes) which then forms the common reference phase map.

The method according to the invention has the advantage that a reference is used that typically forms the basis of a better quality of the measurement data anyway over the entire imaging region, such that effects of low sensitivity (if a different B1 field map than the reference is considered) are present less there, or ideally are not present at all. Relative to the reference, data are thus present that include fewer errors, such that errors are not transferred (as in the procedure in the prior art) from a measurement of a specific excitation mode or a combination of excitation modes to all other excitation modes. The acquisition of the first magnetic resonance data and/or the determination of the Larmor frequency value also advantageously take place (which will be described in further detail below) so that the Nyquist phase wrapping is taken into account so that—after the phase frequency value is taken into account via calculation in the correction—phase wrapping effects that are unwanted can be avoided at least in part. Overall, the quality and reliability of the B1 field maps are thus markedly increased by the procedure according to the invention because the B0 phase map determined from the first magnetic resonance data can be used to define a high-quality correction relative to a reference phase map.

It should be noted that, in spite of the fact that the present invention is naturally related to the consideration of the phases, amplitudes of the B1 field can also be additionally determined from the second magnetic resonance data.

Two basic versions of the method according to the invention are available, namely the separate measurement of the first and second magnetic resonance data and the joint measurement of the first and second magnetic resonance data. The latter case is preferred.

In a less preferred embodiment of the present invention, the first magnetic resonance data are measured at a separate time from the measurement of the second magnetic resonance data. This means that a B0 mapping will initially be used in order to determine the Larmor frequency values that describe the deviations from the nominal Larmor frequency of the magnetic resonance device. It is preferred that this separate measurement is implemented so that high-quality B0 maps with Larmor frequency values are obtained.

An essentially homogeneous excitation and/or an excitation supplying a minimum signal strength is used in the acquisition of the first magnetic resonance data. This means that a sufficiently high signal exceeding the minimum signal strength is optimally present over the entire imaging region in the acquisition of the first magnetic resonance data, such that a high signal-to-noise ratio (SNR) is provided in the entire relevant region (thus the imaging region). This cannot be reliably assured in the excitation modes for the second magnetic resonance data. For example, a circularly polarized homogeneous excitation can be used.

In this alternative, it is also advantageous to us a phase unwrap algorithm in the evaluation of the first magnetic resonance data. Such algorithms are known in the art (as described above) and serve to avoid Nyquist phase wrapping, thus ideally to resolve ambiguities.

In the case of separate acquisition of the first and second magnetic resonance data, the method according to the invention naturally (also) allows different echo times (and thus different correction maps) to be used for different excitation modes in the acquisition of the second magnetic resonance data. It is only essential that the echo times are known in the acquisition of the second magnetic resonance data, such that correction maps can also be respectively determined for different echo times via the knowledge of the Larmor frequency value. Although different correction maps then exist for the different excitation modes, B1 phase maps are obtained that relate to this same reference phase map.

In the preferred versions at least a portion of the second magnetic resonance data and the first magnetic resonance data are measured simultaneously, with at least a portion of the second magnetic resonance data forming (being) first magnetic resonance data. The measurement processes can thus be combined (for example in order to save measurement time). In an extremely simple embodiment the measurement (data acquisition) takes place at two echo times in the measurement of one of the excitation modes in order to generate the first magnetic resonance data. However, according to the invention this is less preferred since— although Larmor frequency values can be determined from such a measurement—these again would have the disadvantage that the sensitivity is possibly not sufficiently high everywhere.

In a preferred embodiment of the present invention, for each excitation mode, two measurements are implemented at different echo times after the excitation, wherein the Larmor frequency value is determined under consideration of the pairs of measurements of the first magnetic resonance data of all excitation modes. This means that magnetic resonance data are acquired twice after each excitation in an excitation mode, and in fact at sufficiently different echo times. An amount of first magnetic resonance data result from this in different sensitivity regions, such that a qualitatively extremely high-grade Larmor frequency value can likewise be obtained given a statistical consideration. If the information of all pairs of first magnetic resonance data is consequently combined for all excitation modes, an excellent B0 mapping is enabled because it is based on multiple experiments (statistical effect) and not just on a single excitation that offers a high SNR in all regions of the B0 map. This is all achieved because each of the pairs already includes the B0 phase mapping information. Two alternatives are again possible for this embodiment of the present invention.

In one of these alternatives, the difference of the echo times in the measurements of the magnetic resonance data is the same for all excitation modes. In particular, the first echo time and the second echo time can be the same for all excitation modes. A pair of phase images are then consequently assumed as first magnetic resonance data for all excitation modes, wherein the first and second phase image have different echo times that exhibit a specific difference. This is the same for all excitation modes. The phase change (and thus the Larmor frequency value) can be determined from this phase change for each pair of phase images, from which phase change a B0 map with average Larmor frequency values can be determined through statistical consideration.

However, in the preferred alternative of this embodiment according to the invention, different differences of the echo times in the measurement of the magnetic resonance data are used for different excitation times. This thus means that the differences of the echo times (and thus at least in part the echo times themselves) differ for different excitation modes. These different differences of the echo times (dephasing times) can be utilized in the evaluation of the first magnetic resonance data (thus in turn of the first and second phase images) in order to particularly advantageously resolve the ambiguities due to the Nyquist phase wrapping. In this case, the method according to the invention thus utilizes the possibility that different acquisitions for the B0 mapping are implemented anyway in order to associate these different differences of the echo times (thus different dephasing times), and it can be remembered that the correction map can be determined without any problem for different echo times of the second magnetic resonance data, thus that the possibility of variation also exists in this regard. Small differences of the echo times can be used in order to resolve ambiguities due to Nyquist phase wrapping; large differences of the echo times offer measurement values with a high SNR. Different methods for resolving the ambiguities can hereby be used, for example the pre-reduction of pairs using a metric; explicit probability multiplication; numeric probability multiplication and the like. In general phase differences determined for excitation modes with different differences of the echo times are analyzed with regard to a Nyquist phase wrap.

As noted, a statistical consideration of the Larmor frequency values obtained from the various experiments for the individual excitation modes is advantageous. In particular, results for different excitation modes can be considered with weighting to determine the Larmor frequency value. An SNR weighting is particularly suitable for this purpose. If no data regarding the SNR are present, a weighting can alternatively take place with the signal. If a phase measurement error or the like is determined, this can also be inserted and used for weighting. More reliably measured Larmor frequency values are thus preferred, and thus an increase of the quality of the measurement is achieved overall.

In a further embodiment of the invention, both measurements of an excitation mode are considered as second magnetic resonance data in by raw phase maps and correction maps being determined for both echo times, and sub-phase maps being determined that are then combined into a common B1 phase map. In this way, all first magnetic resonance data can also be used as second magnetic resonance data, and an improvement of the quality also results there by statistics. Due to the special type of reference that corrects the effects of the B0 field deviation, corrections can be determined for all echo times, consequently also for both measurements of an excitation mode. The combination can also be implemented with weighting, for example via a weighted addition, wherein the SNR is again preferably used for weighting.

In the present invention, it is generally advantageous to select the difference of the echo times for the first magnetic resonance data in a suitable range, such as greater than one millisecond, for example. Moreover, it is also possible to fix the difference of the echo times, or their lower boundary to other factors, for example the position of a fat off-resonance or the like.

In addition to the method, the invention also encompasses a magnetic resonance apparatus that has a control device designed to implement the method according to the invention. Such a magnetic resonance apparatus has a radio-frequency coil arrangement that can be controlled via multiple transmission channels, which means amplitude and phase can be determined as control parameters for each transmission channel independently of other transmission channels. For example, the transmission channels are associated with different coil elements of the radio-frequency coil arrangement. In order to achieve specific goals—for example a local arrangement and/or a radio-frequency shimming—via suitable control of the radio-frequency coil arrangement, B0 maps and B1 maps are required, wherein the B1 phase maps are determined by the control device implementing the method according to the invention. For this purpose, the control device controls the remaining components of the magnetic resonance device to acquire the first and second magnetic resonance data and then evaluates the data, with (for example) a B0 mapping unit (Larmor frequency determination unit), provided as part of the control device, determining the Larmor frequency values. A correction map determination unit determines the correction map for the B1 raw phase map, and a B1 phase map determination unit subtracts the correction map from the B1 raw phase maps. All statements with regard to the method according to the invention apply analogously to the magnetic resonance apparatus according to the invention, so that the aforementioned advantages can also be achieved with the apparatus.

The present invention also encompasses a non-transitory, computer-readable data storage medium encoded with programming instructions that, when the storage medium is loaded into a computerized control and evaluation system of a magnetic resonance apparatus, caused the magnetic resonance apparatus to operate so as to execute any or all of the embodiments of the method according to the invention as described above.

DESCRIPTION OF THE PREFERRED EMBODIMENTS

Figure 1:
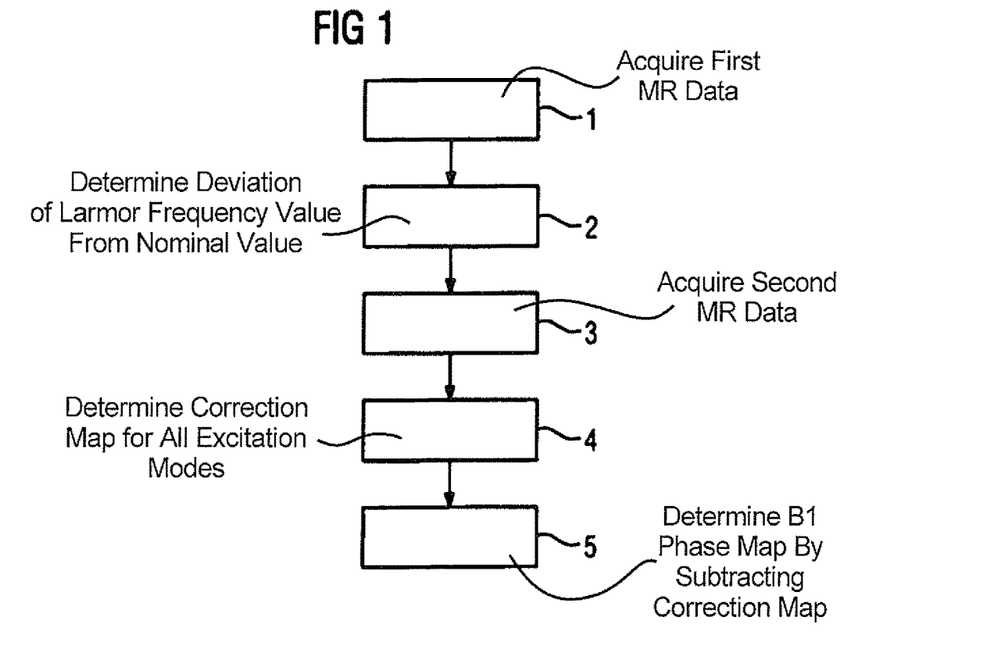
FIG. 1 is a flowchart of a first exemplary embodiment of the method according to the invention.

FIG. 1 is a flowchart of a first exemplary embodiment of the method according to the invention to determine B1 phase maps, wherein a determination of B1 amplitude maps can naturally take place in parallel in a known manner so that in total B1 field maps with complex fields are obtained that can be utilized together with a B0 map (that is also created within the scope of the method according to the invention) as a basis for determination of control sequences for a radio-frequency coil arrangement of a magnetic resonance device (via which the different excitation modes are also realized). The radio-frequency coil arrangement has multiple transmission channels so that, for example, a parallel transmission is enabled.

In the exemplary embodiment according to FIG. 1, in step 1 a measurement of first magnetic resonance (MR) data is initially implemented separately within the scope of a B0 mapping. For this purpose, ultimately first magnetic resonance data are acquired at two different echo times, namely a first echo time and a second echo time that form a specific difference: the dephasing time. A first phase image is consequently created via the phases of the first measurement, and a second phase image is created via the phases of the second measurement. By taking the differences of these phase images into account, phase changes can be determined that occur within the difference of the echo times due to deviations of the basic magnetic field (B0 field) from a nominal basic magnetic field. After the difference of the echo times is known, in step 2 a Larmor frequency value (here the deviation of the local Larmor frequency from the nominal Larmor frequency of the magnetic resonance device that results from the nominal basic magnetic field) can be determined for the evaluation of the first magnetic resonance data. From the spatially resolved Larmor frequency values, for arbitrary echo times correction values for incorrect phases arising during these times can consequently be determined at the locations in the imaging region of the magnetic resonance device, consequently correction maps (which will be discussed in detail in the following).

However, it is noted that the determination of the Larmor frequency values takes place such that an optimally low-error, precise determination is possible. For this, in step 1 an optimally homogeneous excitation in the imaging region is used to measure the first magnetic resonance data in order to obtain a high SNR (signal-to-noise ratio) as extensively as possible. Moreover, in step 2 algorithms for phase unwrapping are also used, thus those algorithms that seek to resolve ambiguities induced by the $2\pi$ factor of the phase.

In step 3, in a separate measurement second magnetic resonance data are then acquired that should form the basis of the B1 phase maps. For this, different excitation modes are used, in particular one excitation mode for each transmission channel. Naturally, it is also conceivable to use excitation modes that use multiple transmission channels in order to later back-calculate the B1 fields for the individual transmission channels.

At this point it is noted that the measurement of the second magnetic resonance data can take place with different echo times for different excitation modes.

Independent of whether the same echo time was always used or whether different echo times have been used, in step 4 a correction map is then determined for all excitation modes (or at least for each occurring echo time), which correction map—if subtracted from raw phase maps determined for the excitation modes from the second magnetic resonance data acquired with the corresponding echo time—leads to B1 phase maps that relate to a common reference map. For simplicity, the reference phase map is thereby presently (and also in the other exemplary embodiments) selected so that it corresponds to a map that would exist given an echo time of zero without active excitation mode. However, because the correction map should correct the effects of the phase evolution due to B0 field deviations, this means that the phases of the correction map are simply calculated with spatial resolution as $$TE^* \Delta \omega_L,$$

wherein TE is the echo time, $\Delta\omega_L$ is the Larmor frequency value (which is the deviation of the local Larmor frequency from the nominal Larmor frequency of the magnetic resonance device).

In step 5, the B1 phase maps are then determined in that the correction maps (as applicable at the corresponding TE) are subtracted. In all B1 phase maps, the phase evolution effects generated by the B0 field are then removed so that all resulting B1 phase maps inevitably relate to the same reference phase map.

Because high-quality, reliable Larmor frequency values have been used, the resulting B1 phase maps are also improved in terms of their quality and reliability.

Figure 2:
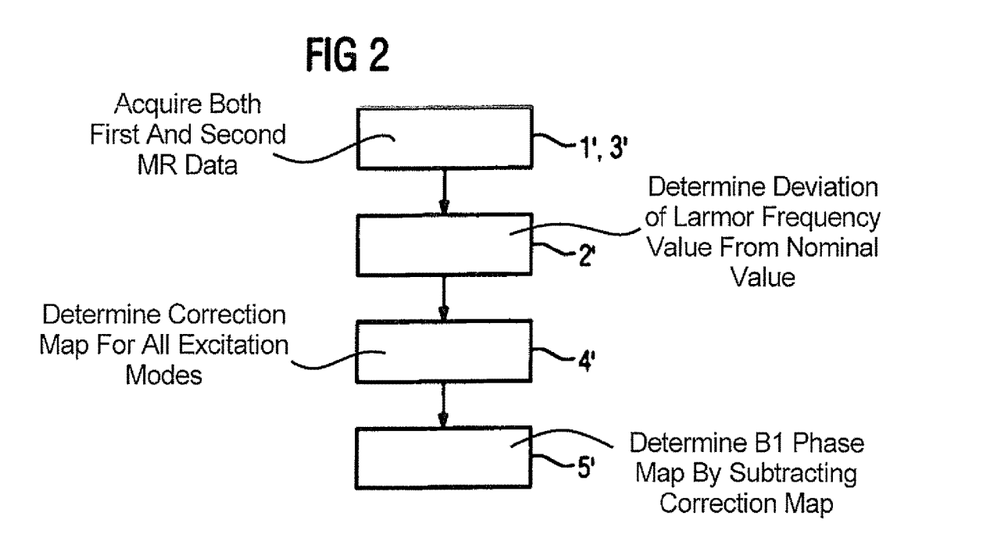
FIG. 2 is a flowchart of a second exemplary embodiment of the method according to the invention.

FIG. 2 shows a further exemplary embodiment of the method according to the invention in which a separate B0 mapping measurement is not required. In a combined step 1', 3', the first magnetic resonance data and the second magnetic resonance data are measured simultaneously, wherein presently the first magnetic resonance data are even at the same time the second magnetic resonance data. For this purpose, for each excitation mode a measurement is implemented at two echo times, namely a first echo time and a second echo time whose difference is fixed in the second exemplary embodiment discussed here (thus is the same for all excitation modes). This thus means that ultimately a first phase image and second phase image are present for each excitation mode in the first and second magnetic resonance data, from which the phase change (and thus also the deviation of the Larmor frequency from the nominal Larmor frequency) can be determined by taking the difference for a fixed dephasing time, which occurs in step 2'. However, if Larmor frequency values (which are also statistically combined) are now present for each excitation mode, such that ultimately a common B0 map that includes the Larmor frequency values for all voxels is created. For this, a weighted average calculation is provided, wherein the weighting for each voxel occurs independent of the signal-to-noise ratio (SNR). More reliable measurement values are more strongly stressed in this way. The entirety of the excitation modes covers the entire imaging region, such that reliable values for the Larmor frequency value are obtained everywhere; the value is additionally further improved via the statistical consideration.

Because the Larmor frequency values are present again at the end of step 2', new correction maps can be determined for the echo times that are used (step 4'), as this has been described above. However, correction maps are calculated both for the first phase image and for the second phase image (which are ultimately the two raw phase images), which correction maps are then also respectively subtracted (in step 5') from the first and second raw phase map (thus the corresponding phase image) so that sub-phase maps are initially determined that are then combined (possibly again with SNR weighting) into a common B1 phase map for the excitation mode.

Figure 3:
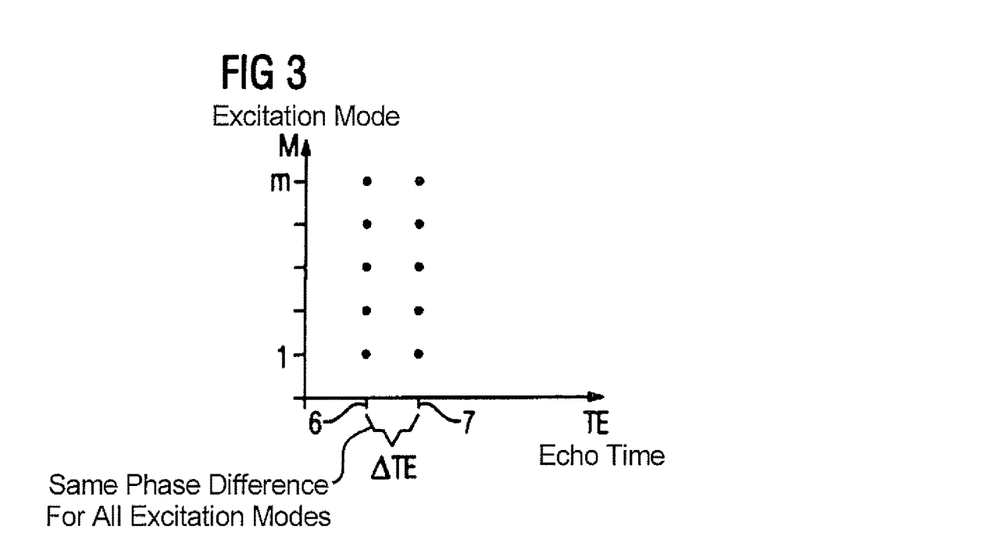
FIG. 3 is a schematic illustration to explain the second exemplary embodiment.

FIG. 3 shows the measurement principle in Step 1', 3' in more detail. The excitation mode M is symbolically plotted there against the echo time TE. For each excitation mode M (from 1 to m, where m is the number of excitation modes), a measurement is clearly respectively implemented at a first echo time 6 and at a second echo time 7 in order to simultaneously acquire the first and second magnetic resonance data (which mutually correspond). The same difference $\Delta TE$ thereby results as a dephasing time for each excitation mode.

Figure 4:
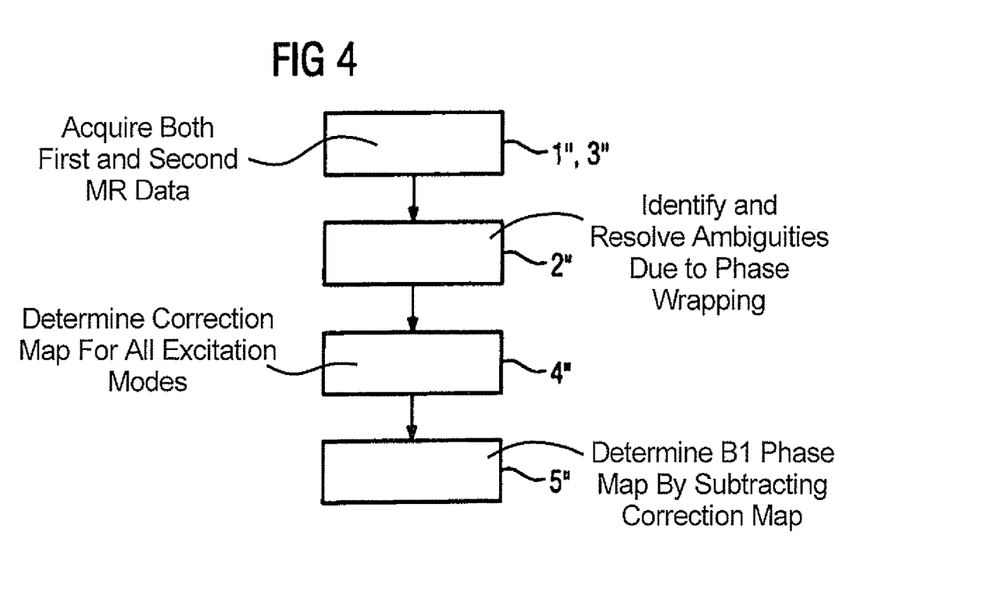
FIG. 4 is a flowchart of a third exemplary embodiment of the method according to the invention.

FIG. 4 now shows a third preferred exemplary embodiment according the invention of the method according the invention, which differs primarily in the joint data acquisition step 1", 3" for the first and second magnetic resonance data, wherein again the first magnetic resonance data are at the same time the second magnetic resonance data. Different differences of the first and second echo time are presently used. This is schematically shown again in FIG. 5 (corresponding to FIG. 3), where again one axis symbolizes the excitation modes, the other axis the echo time. The same first echo time 6 is in fact presently used for all excitation modes, wherein this can also be different in other exemplary embodiments. However, the second echo times 7' at which the second measurement thus occurs are always different, such that both short dephasing times $\Delta TE_1$ and long dephasing times (for example $\Delta TE_m$ in FIG. 5) and values in between these are used (what is furthermore designated with dephasing time is the difference between the first echo time 6 and the respective second echo time 7').

Figure 5:
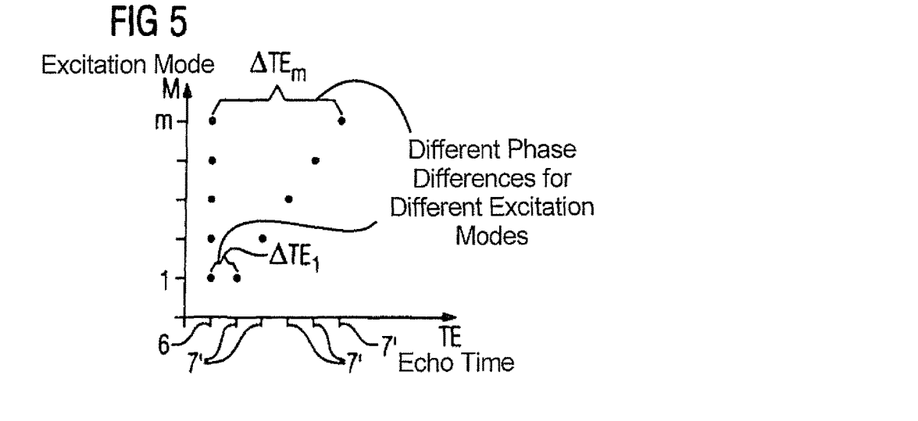
FIG. 5 is a schematic illustration to explain the third exemplary embodiment.

Nevertheless, after the dephasing times for the respective experiments are known the respective measurement pairs for the excitation modes (thus the first phase image and the second phase image) offer the possibility to determine spatially resolved Larmor frequency values that differ primarily in their error (due to the low SNR given short dephasing times) and the risk of Nyquist phase wrapping (given long dephasing times). In the modified evaluation step 2', an evaluation is accordingly initially implemented to identify the ambiguities due to phase wrapping and resolve them. The obtained phase changes are corrected as necessary before the B0 maps with the Larmor frequency values for each voxel can then finally be obtained again (for example via weighted mean calculation).

As was presented, the creation of correction maps for different echo times 6, 7' is possible without any difficulty, which also then occurs in step 4" in order to determine the B1 phase maps analogous to the second example in step 5".

It is further noted that gradient echo sequences are preferably used to acquire the first and second magnetic resonance data, as this is known in principle for mapping methods. In the first exemplary embodiment in which an optimally extensive and homogeneous coverage of the imaging region in the B0 mapping should take place in step 1, a multiple echo phase mapping sequence can be used, wherein a multiple echo Bloch-Siegert sequence is preferably used; see also in this regard the article by P. L. de Sousa et al., "Simultaneous B1+ and B0 mapping using Dual-Echo-Bloch-Siegert (DEBS) sequence", Proc. Intl. Soc. Mag. Reson. Med. 20 (2012), 2505.

Figure 6:
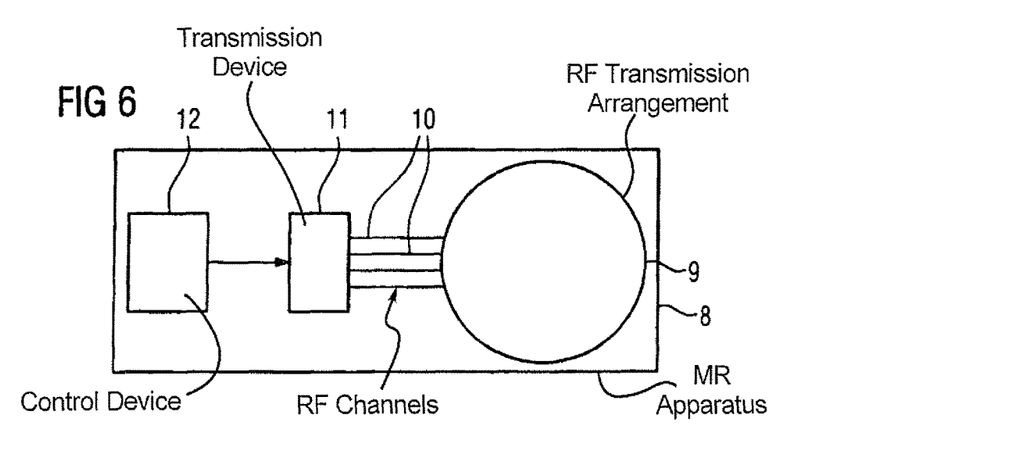
FIG. 6 illustrates a magnetic resonance device according to the invention.

FIG. 6 is a schematic illustration of a magnetic resonance (MR) apparatus 8 according to the invention, wherein for the sake of simplicity only the components that are relevant to the present invention are actually shown, and a depiction of the basic magnetic field unit, the gradient coil arrangement and the like is omitted for clarity. The magnetic resonance apparatus 8 has a radio-frequency (RF) coil arrangement (indicated at 9) that can be operated by a transmission device 11 via multiple schematically depicted transmission channels 10 such that an amplitude and a phase can be independently selected for each transmission channel 10. Like the other components of the magnetic resonance device 8 that are not presented in detail here, the transmission system—formed by the radio-frequency coil arrangement 9 and the transmission device 11—is controlled by a control device 12, which is designed to implement the method according to the invention and is shown in detail in FIG. 7.

Figure 7:
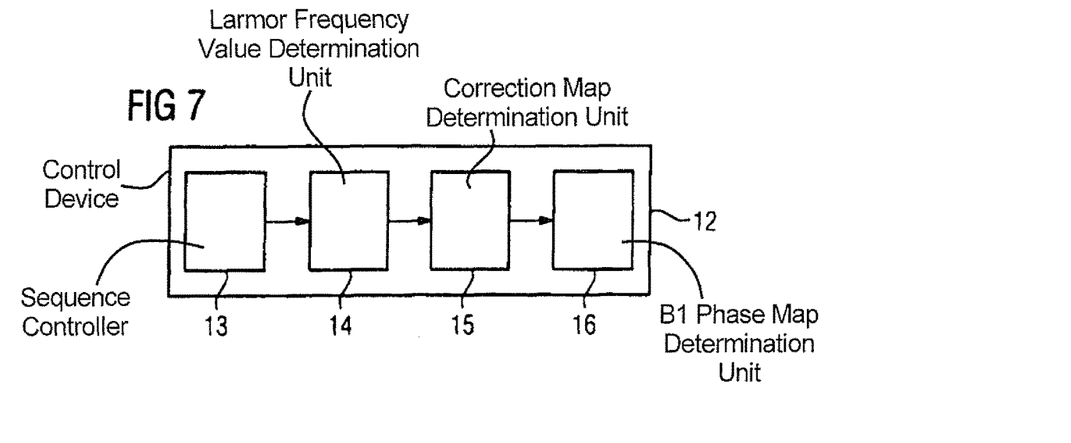
FIG. 7 illustrates the structure of the control device of the magnetic resonance device of FIG. 6.

The control device 12 thus has a sequence controller 13 via which the excitation modes (and possibly other excitations) can be realized within the scope of the present invention in order to obtain the first and second magnetic resonance data. The first magnetic resonance data are initially evaluated in a Larmor frequency value determination unit 14 in order to obtain the B0 maps with the Larmor frequency values (see steps 2, 2', 2"). A correction map determination unit 15 determines the correction maps according to steps 4, 4', 4". Finally, the control device 12 further has a B1 phase map determination unit 16 that is designed to implement steps 5, 5', 5".

Although modifications and changes may be suggested by those skilled in the art, it is the intention of the inventors to embody within the patent warranted hereon all changes and modifications as reasonably and properly come within the scope of their contribution to the art.

We claim as our invention:

1. A method of determining a B1 phase map that is valid for at least two excitation modes, selected from a plurality of available excitation modes, of a radio-frequency (RF) coil arrangement of a magnetic resonance (MR) apparatus, said RF coil arrangement comprising multiple, independently controllable transmission channels, and said determined B1 phase map describing, with spatial resolution, a phase of a B1 field generated in a respective excitation mode, relative to a common reference phase map for all of said available excitation modes, said method comprising:

operating said MR apparatus, which has a nominal Larmor frequency, in order to acquire first MR data from an imaging volume, said first MR data describing a phase change of a basic magnetic field of the magnetic resonance apparatus, said phase change occurring between a first echo time and a second echo time of a data acquisition sequence;

providing said acquired first MR data to a processor and, in said processor, evaluating said phase change described in said acquired first MR data in order to determine spatially resolved Larmor frequency values that describe deviations at respective spatial locations in said imaging volume from the nominal Larmor frequency of the magnetic resonance apparatus;

operating the magnetic resonance apparatus in order to execute an MR data acquisition sequence with said B1 field in one of said at least two excitation modes so as to acquire second MR data at respective echo times that are defined by said MR data acquisition sequence;

providing said acquired second MR data to said processor and, in said processor, generating a raw phase map of said B1 field therefrom, and calculating a correction phase map relative to the common reference phase map, dependent on said spatially resolved Larmor frequency values, and the respective echo times in the acquisition of the second MR data, and subtracting the correction phase map from the raw phase map in order to obtain said B1 phase map that is valid for said at least two excitation modes; and making said B1 phase map that is valid for said at least two excitation modes available in electronic form at an output of said processor.

2. A method as claimed in claim 1 comprising employing, as said common reference phase map, a phase map that would exist at an echo time of zero without activation of an excitation mode.

3. A method as claimed in claim 1 comprising acquiring said first MR data in a separate MR data acquisition session from acquisition of said second MR data.

4. A method as claimed in claim 3 comprising, in said processor, using a phase unwrap algorithm in order to evaluate said first MR data.

5. A method as claimed in claim 4 comprising acquiring said first MR data using an excitation selected from the group consisting of an excitation that is substantially homogeneous in said imaging region of the MR apparatus, and an excitation that results in a predetermined minimum signal strength of a signal from which the first MR data are detected.

6. A method as claimed in claim 3 comprising generating different correction phase maps for each of said at least two excitation modes.

7. A method as claimed in claim 2 comprising evaluating said first MR data in said processor using a phase unwrap algorithm, and generating different correction phase maps, for each of said at least two excitation modes.

8. A method as claimed in claim 1 comprising acquiring at least a portion of the second MR data and at least a portion of the first MR data simultaneously.

9. A method as claimed in claim 7 comprising, for each of the at least two excitation modes, operating said MR apparatus with two separate MR data acquisitions at respectively different echo times, after excitation occurs with each of said at least two excitation modes, and determining said Larmor frequency values in said processor by using said two separate acquisitions of said first MR data for each of the at least two said excitation modes.

10. A method as claimed in claim 7 comprising maintaining a difference of said echo times to be the same for all of said excitation modes in the acquisition of said second MR data.

11. A method as claimed in claim 8 comprising using different echo times for the at least two excitation modes in the acquisition of said second MR data.

12. A method as claimed in claim 10 comprising, in said processor, determining phase changes for each of the at least two excitation modes by analyzing the phase differences of said echo times with respect to a Nyquist phase wrap.

13. A method as claimed in claim 7 comprising using respective results for said at least two different excitation modes with respective weightings in said processor in order to determine said Larmor frequency values.

14. A method as claimed in claim 13 comprising selecting said weighting from the group consisting of a signal-to-noise (SNR) weighting, weighting according to respective signal strengths, and weighting with a phase measurement error.

15. A method as claimed in claim 7 comprising operating said MR apparatus for both acquisitions of said second MR data in said at least two excitation modes, by determining raw phase maps and correction maps for each echo time, and combining the respective raw phase maps and the correction phase maps for each of the individual echo times in order to form said B1 phase map that is valid for said at least two excitation modes.

16. A method as claimed in claim 1 comprising operating said MR apparatus where the difference of said echo times, in the acquisition of said second MR data, is less than 1 millisecond.

17. A magnetic resonance (MR) apparatus configured in order to determine a B1 phase map, that is valid for at least two excitation modes, of an RF coil arrangement having a plurality of available excitation modes, comprising:

an MR data acquisition unit having a nominal Larmor frequency, and having an RF coil arrangement comprising multiple, independently controllable transmission channels, operable in at least two excitation modes, said RF coil arrangement producing a B1 field in each of said at least two excitation modes;

a control unit configured to operate said MR data acquisition unit in order to acquire first MR data from an imaging volume, said acquired first MR data describing phase changes of a basic magnetic field of the MR data acquisition unit, with said phase changes occurring between a first echo time and a second echo time of a data acquisition sequence;

a processor that is provided with said acquired first MR data, said processor being configured to evaluate said phase changes described in said acquired first MR data in order to determine spatially resolved Larmor frequency values that describe deviations at respective spatial locations in said imaging volume from the nominal Larmor frequency of the magnetic resonance apparatus;

said control unit being configured to operate the magnetic resonance apparatus in order to execute an MR data acquisition with said B1 field in one of said at least two excitation modes so as to acquire second MR data at respective echo times that are defined by said MR data acquisition sequence;

said processor being provided with said second MR data and with a common reference phase map for all of said excitation modes, said processor being configured to generate a raw phase map of said B1 field in therefrom, and to calculate a correction phase map relative to said common reference phase map dependent on said spatially-resolved Larmor frequency values and the echo times in the acquisition of the second MR data, and subtract the correction phase map from the raw phase map in order to obtain a B1 phase map that is valid for said at least two excitation modes; and said processor being configured to make said B1 phase map that is valid for said at least two excitation modes available in electronic form at an output of said processor.

18. A non-transitory, computer-readable data storage medium included with programming instructions, said data storage medium being loaded into a computerized control and evaluation system of an MR apparatus, said MR apparatus comprising a radio-frequency (RF) coil arrangement with multiple, independently controllable transmission that channels, said programming instructions causing said control and evaluation system that determines a B1 phase map that is valid for at least two excitation modes, selected from a plurality of available excitation modes, of the RF coil arrangement, said B1 phase map describing, with spatial resolution, a phase of a B1 field generated in a respective excitation mode, relative to a common reference phase map for all of said available excitation modes, by:

operating said MR apparatus, which has a nominal Larmor frequency, in order to acquire first MR data from an imaging volume, said first MR data describing a phase change of a basic magnetic field of the magnetic resonance apparatus, said phase change occurring between a first echo time and a second echo time of a data acquisition sequence;

providing said acquired first MR data to a processor and, in said processor, evaluating said phase change described in said acquired first MR data in order to determine Hall spatially resolved Larmor frequency values that describe deviations at respective spatial locations in said imaging volume from the nominal Larmor frequency of the magnetic resonance apparatus;

operating the magnetic resonance apparatus in order to execute an MR data acquisition sequence with said B1 field in one of said at least two excitation modes so as to acquire second MR data at respective echo times that are defined by said MR data acquisition sequence;

providing said second MR data to said processor and, in said processor, generating a raw phase map of said B1 field therefrom, and calculating a correction phase map relative to the common reference phase map, dependent on said spatially resolved Larmor frequency values, and the respective echo times in the acquisition of the second MR data, and subtracting the correction phase map from the raw phase map in order to obtain said B1 phase map that is valid for said at least two excitation modes; and making said B1 phase map that is valid for said at least two excitation modes available in electronic form at an output of said processor.

\* \* \* \* \*